(12) United States Patent
Matsuzawa et al.

(10) Patent No.: US 6,472,724 B1
(45) Date of Patent: Oct. 29, 2002

(54) ELECTRONIC DEVICE STRUCTURE CAPABLE OF PREVENTING MALFUNCTION CAUSED BY ELECTROMAGNETIC WAVE COMING FROM OUTSIDE

(75) Inventors: Hajime Matsuzawa; Koetsu Tamura, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/551,172

(22) Filed: Apr. 17, 2000

(30) Foreign Application Priority Data

Apr. 19, 1999 (JP) .......................................... 11-110583

(51) Int. Cl.[7] ........................ H01L 23/552; H01L 23/06
(52) U.S. Cl. ........................ 257/659; 257/698; 257/699
(58) Field of Search ................................ 257/659, 660, 257/698, 699

(56) References Cited

U.S. PATENT DOCUMENTS

| | | | | |
|---|---|---|---|---|
| 4,616,406 A | * | 10/1986 | Brown | 257/697 |
| 5,103,292 A | * | 4/1992 | Mahulikar | 257/697 |
| 5,394,011 A | * | 2/1995 | Yomamoto et al. | 257/693 |
| 5,491,303 A | * | 2/1996 | Weiss | 174/262 |
| 5,585,671 A | * | 12/1996 | Nagesh et al. | 257/697 |
| 5,690,270 A | * | 11/1997 | Gore | 228/180.22 |
| 5,694,300 A | * | 12/1997 | Mattei et al. | 361/818 |
| 5,866,943 A | * | 2/1999 | Mertol | 257/712 |

FOREIGN PATENT DOCUMENTS

| | | | | |
|---|---|---|---|---|
| EP | 0 544 915 A1 | * | 6/1993 | H01L/23/12 |
| JP | 8-288686 | | 11/1996 | |

* cited by examiner

*Primary Examiner*—Allan R. Wilson
(74) *Attorney, Agent, or Firm*—Whitham, Curtis & Christofferson, P.C.

(57) ABSTRACT

In an electronic device structure, a high dam is formed on a circuit board so as to enclose input/output terminals of an electronic component mounted on the circuit board. The input/output terminals are projected from a body of the electronic component and connected to a printed circuit formed on the circuit board. The body is covered with a metal case.

7 Claims, 7 Drawing Sheets

ELECTRONIC DEVICE STRUCTURE CAPABLE OF PREVENTING MALFUNCTION CAUSED BY ELECTROMAGNETIC WAVE COMING FROM OUTSIDE

BACKGROUND OF THE INVENTION

This invention relates to an electronic device structure having an electronic component and a circuit board on which the electronic component is mounted, and more particularly, relates to an electronic device structure having an electromagnetic shielding for shielding input/output terminals of an electronic component mounted on a circuit board from electromagnetic waves coming from the outside.

Generally, an electronic device such as an IC chip or an LSI chip is packaged in a PGA (Pin Grid Array) package or a BGA (Ball Grid Array) package having a plurality of input/output terminals (i.e. pins or balls) to form an electronic component. The electronic component is mounted on a circuit board and electrically connected to a printed circuit formed on the circuit board.

It is well known that the electronic device is influenced by electromagnetic waves coming from the outside. That is, there is a case where the electronic device malfunctions when it receives the electromagnetic waves. So the PGA or BGA package is covered with a metal case of film as an electromagnetic shielding to shield the electronic device from the electromagnetic waves coming from the outside.

However, the input/output terminals are still exposed and inevitably receive the electromagnetic waves coming from the outside. Accordingly, there is a case where malfunction (or faulty operation) is made in the electronic device by the electromagnetic waves received with the input/output terminals though the metal film covers the electronic device.

Moreover, the exposed input/output terminals radiate other electromagnetic waves caused by an operation of the electronic device. Consequently, there is a case where other electronic device located near the electronic component faultily operates when the it receives the electromagnetic waves radiated from the input/output terminals.

SUMMARY OF THE INVENTION

It is therefore an object this invention to provide an electronic device structure which is capable of preventing input/output terminals of an electronic component mounted on a circuit board from receiving electromagnetic waves coming from the outside.

It is another object of this invention to provide an electronic device structure which is capable of preventing input/output terminals of an electronic component mounted on a circuit board from radiating electromagnetic waves caused by an operation of the electronic component.

It is still another object of this invention to provide an electronic device structure which is capable of preventing an electronic component mounted on a circuit board from malfunctioning.

It is farther still another object of this invention to provide an electronic device structure which does not radiate electromagnetic waves.

Other object of this invention will become clear as the description proceeds.

According to the gist of this invention, an electronic device structure comprises a circuit board having a printed circuit. An electronic component has a body and an input/output terminal projected from the body and mounted on the circuit board by connecting the input/output terminal to the printed circuit. A first electromagnetic shielding is formed on the circuit board for enclosing the input/output terminal when the electronic component is mounted on the circuit board.

In the electronic device structure, the body is covered with a second electromagnetic shielding. The first electromagnetic shielding is located between the circuit board and the body mounted on the circuit board or partially encloses the body mounted on the circuit board. The first electromagnetic shielding has a square frame shape. The first electromagnetic shielding is made of conductive paste such as solder paste by a screen printing method.

DESCRIPTION OF THE PREFERRED EMBODIMENTS

Figure 1:
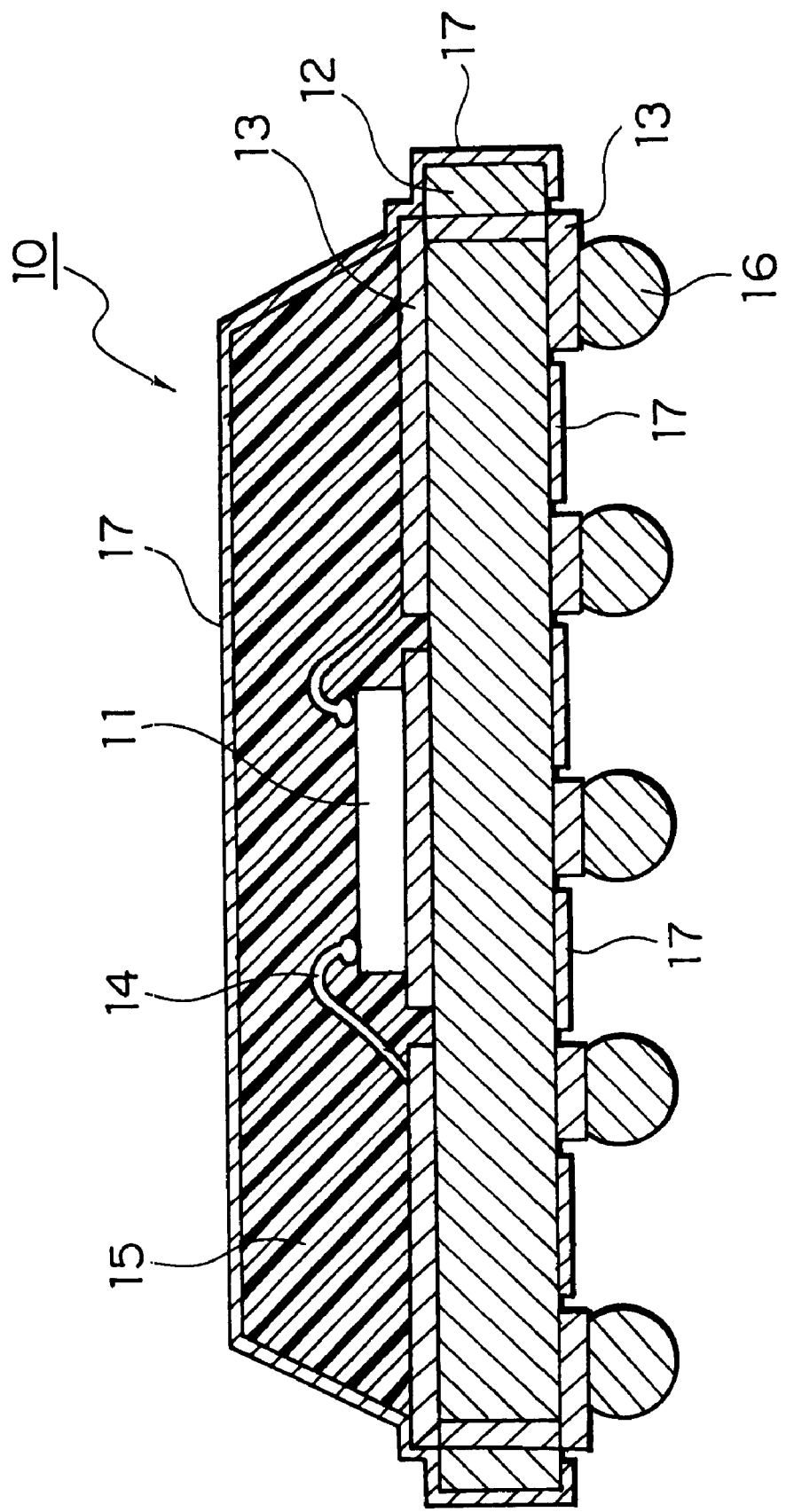
FIG. 1 shows a sectional view of a conventional electronic component having a semiconductor device packaged in a BGA package.

Referring to FIG. 1, description will be at first directed to a conventional electronic component for a better understanding of this invention.

In FIG. 1, the conventional electronic component 10 has a semiconductor device 11 such as an IC chip, an LSI chip, etc. and a BGA (Ball Grid Array) package for packaging the semiconductor device 11.

The BGA package comprises a base 12 on which the semiconductor device 11 is mounted. Printed wiring 13 is formed on both upper and lower surfaces of the base 12. Metal wires 14 connects the semiconductor device 11 to the printed wiring 13 at the upper surface of the base 12 when the semiconductor device chip 11 is mounted on the upper surface of the base 12. A resinous seal 15 is formed on the upper surf ace of the base 12 to seal the semiconductor device 11 together with the metal wires 14. Solder balls 16 are formed on the printed wiring 13 at the lower surface of the base 12. The solder balls 16 are used for input/output terminals of the electronic component 10. A metal film 17 as an electromagnetic shielding covers the whole outside surface of the electronic component 10 except for exposed parts of the printed wiring 13 and the solder balls 16. Additionally, the metal film 17 is isolated from the printed wiring 13.

The metal film 17 prevents electromagnetic waves come from the outside from arriving to the semiconductor device 11. That is, the metal film 17 prevents malfunction caused by the electromagnetic waves in the semiconductor device 11.

Such an electronic component is disclosed in Japanese Unexamined Japanese Patent Publication (JP-A) No. H8-288686.

However, the conventional electronic component has a fault that the solder balls 16 are exposed to the atmosphere and inevitably receives the electromagnetic waves. The electromagnetic waves received by the solder balls 16 are transmitted to the semiconductor device 11 through the printed wiring 13 and brings malfunction to the semiconductor device 11.

Moreover, there is a case that the solder balls 16 radiate electromagnetic waves cased by an operation of the electronic device chip 11. The electromagnetic waves radiated from the solder balls 16 causes faulty operations to neighboring devices. Particularly, with increase of operation speed of the electronic device 11, influences of the electromagnetic wave radiated from the solder balls 16 becomes large.

Referring to FIGS. 2 through 5, the description will proceed to an electronic device structure according to a first embodiment of this invention.

Figure 2:
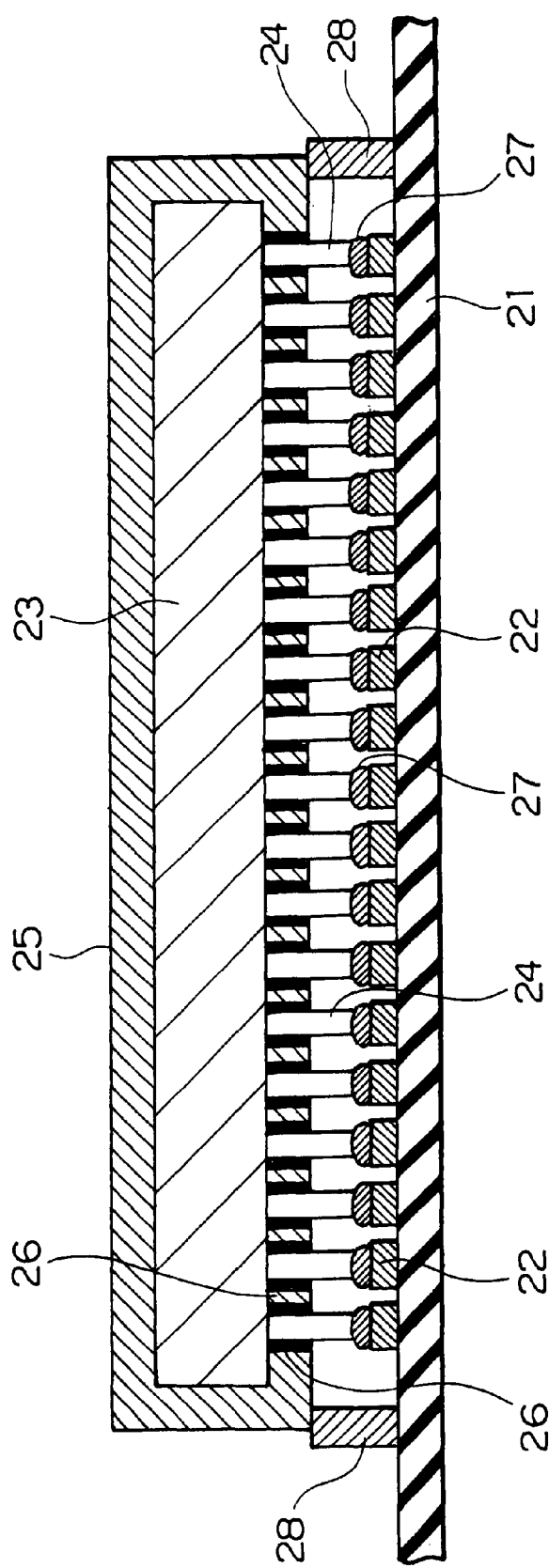
FIG. 2 shows a sectional view of an electronic device structure according to a first embodiment of this invention.
Figure 3:
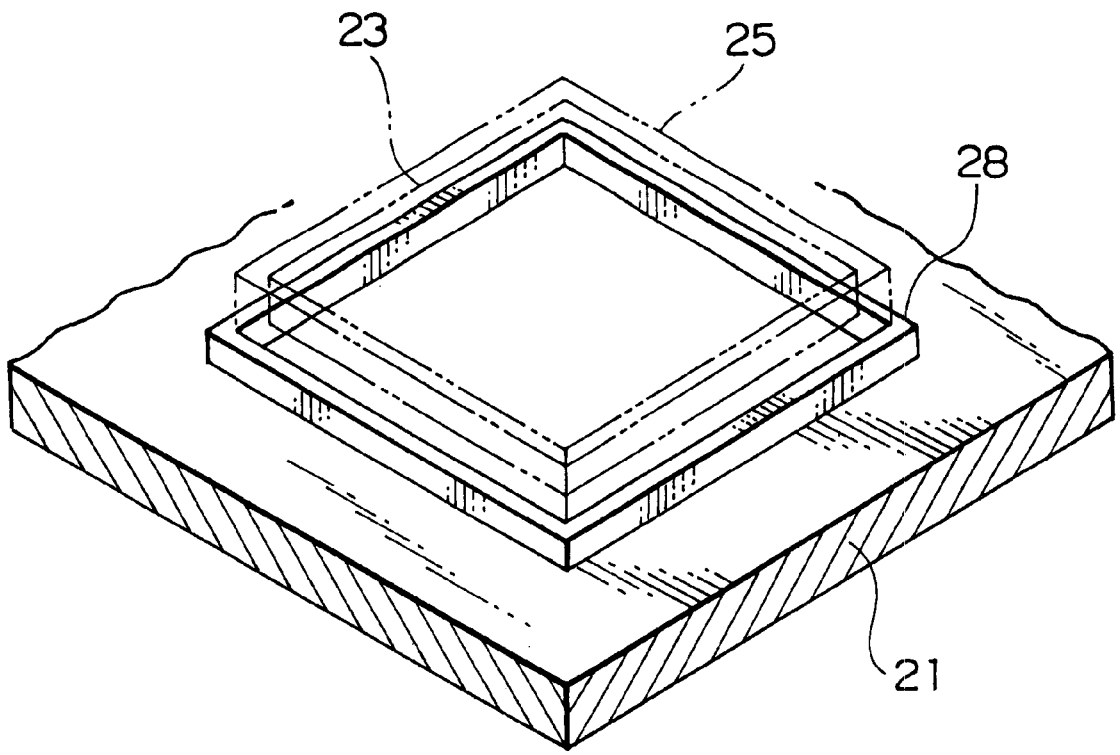
FIG. 3 shows a perspective view of a high dam of FIG. 2.

In FIG. 2, the electronic device structure comprises a circuit board 21 having a printed circuit which includes a plurality of contact pads 22 formed on an upper surface of the circuit board 21. An electronic component 23 has a body including an electronic device (not shown) and a plurality of input/output terminals 24 protruded from the body. A metal case 25 covers the body of the electronic component 23 except for a neighborhood of each of the input/output terminals 24. Insulators 26 are placed between the metal case 25 and the input/output terminals 24 to insulate the input/output terminals from the metal case 25. The electronic component 23 is mounted on the circuit board 21 and the input/output terminals 24 are connected to contact pads 22, respectively, by soft solder 27. A high dam 28 is formed on the upper surface of the circuit board 21 as an electromagnetic shielding so as to enclose the input/output terminals 24 and so as to keep contact with a lower surface of the metal case 25 mounted on the circuit board 21 at its top. The high dam 28 has a square frame shape corresponding to a shape of the electronic component 23 as shown in FIG. 3.

Figure 4:
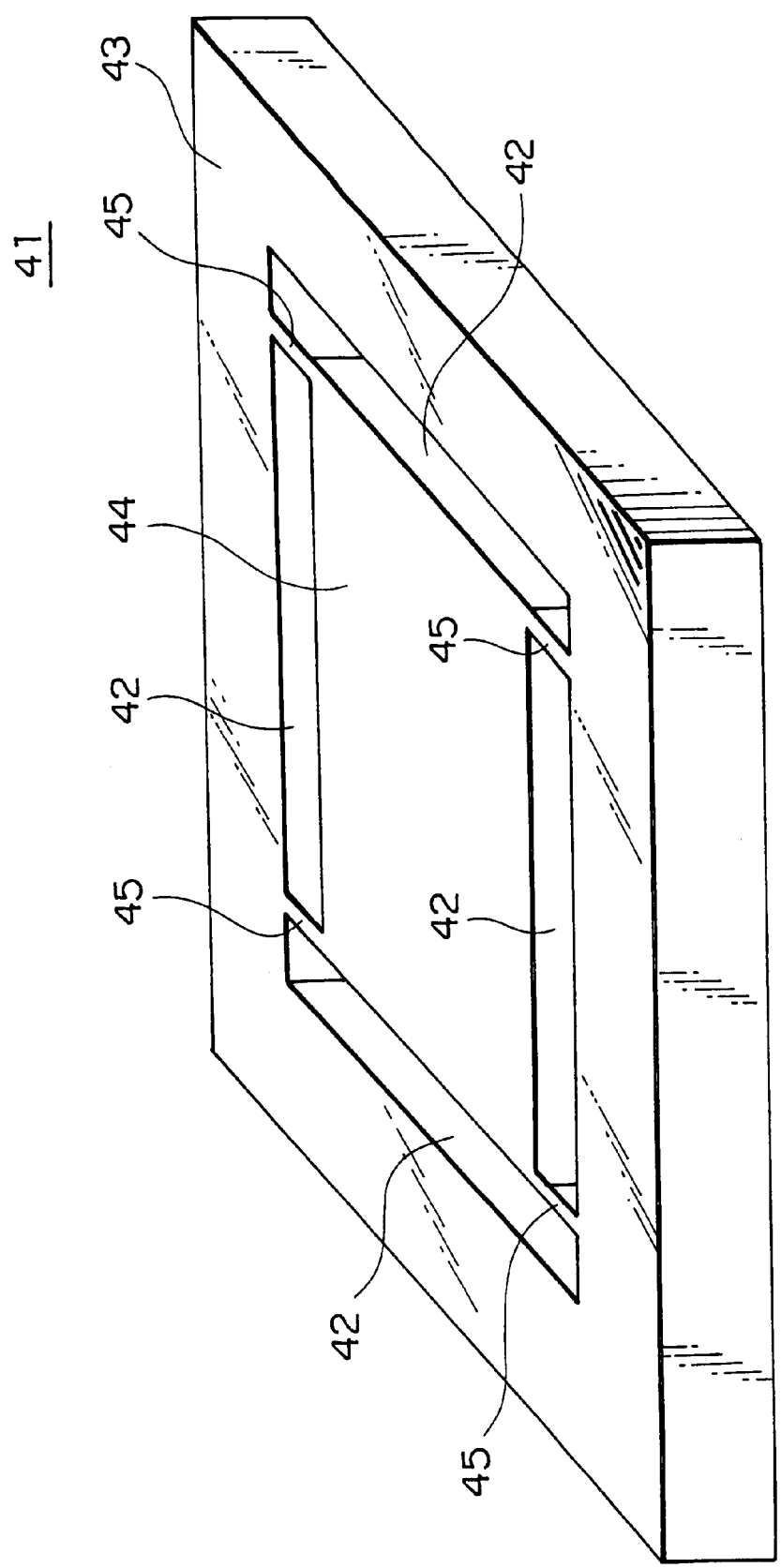
FIG. 4 shows a perspective view of a metal mask for forming the high dam of FIG. 2.

The high dam 28 is formed by, for example, a screen printing method using a metal mask such as shown in FIG. 4 and solder paste. The solder paste has strong adhesive strength and can easily be purchased at a low price. In addition, the solder paste works easily.

In FIG. 4, the metal mask 41 has a thickness corresponding to the height of the high dam 28 and has openings or apertures 42 which are continuous with one another at the rear side of the metal mask 41 so as to correspond to the shape of the high dam 28. That is, the metal mask 41 has an outer frame 43 and a middle plate 44 connected to the outer frame 43 with thin beams 45.

Figure 5:
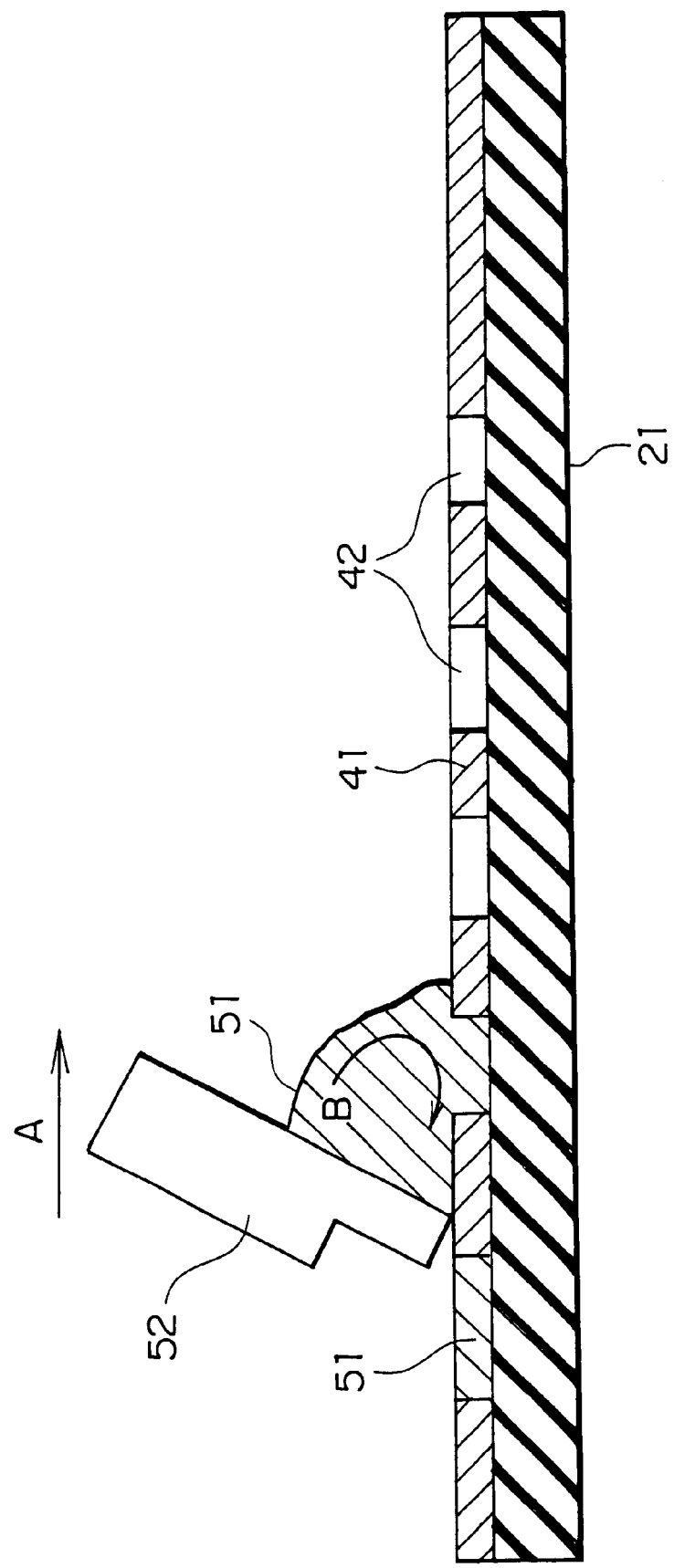
FIG. 5 shows a sectional view for describing a method of forming the high dam of FIG. 2.

In the screen printing method, the metal mask 41 is put on the upper surface of the circuit board 21 as illustrated in FIG. 5. Then, solder paste 51, which is conductive material, is put on the metal mask 41 and pushed by a squeegee 52 (i.e. a rubber spatula) along to an arrow A. As a result, the solder paste 51 rolls on the metal mask 41 (as shown by an arrow B) and is squeezed into the openings 42 with the squeegee 52. Because the solder paste 51 is soft, it easily arrives the upper surface of the circuit board 21 in the openings 42. Next, the solder paste 51 is heated and hardened. After the solder paste 51 is hardened, the metal mask 41 is taken away from the surface of the circuit board 21. Thus the high dam 28 is formed on the circuit board 21.

Additionally, the contact pads 22 may be formed by the screen method together with the high dam 28. In this case, the metal mask 41 has two areas which are different from each other in thickness making a difference between the contact pads 22 and the high dam 28 in height.

Returning to FIG. 2, the metal case 25 shields the body of the electronic component 23 from electromagnetic waves come from the outside. On the contrary, the metal case 25 prevent electromagnetic waves from radiating from the body of the electronic component 23 to the outside. Similarly, the high dam 28 shields the input/output terminals 24 from the electromagnetic waves come from the outside and prevents electromagnetic waves from radiating from the input/output terminals 24 to the outside.

The metal case 25 and the high dam 28 transform the electromagnetic waves incident on them into electric current. The electric current is transformed into heat or flows the ground through a ground wire (not shown) on the circuit board 21.

Because the metal case 25 and the high dam 28 shield the electronic component 23 as mentioned above, faulty operation or malfunction is not caused in the electronic component 23 by the electromagnetic waves come from the outside. Furthermore, because electromagnetic waves generated by the electronic component 23 does not escape to the outside, neighboring devices (not shown) located near the electronic component 23 does not malfunction.

Figure 6:
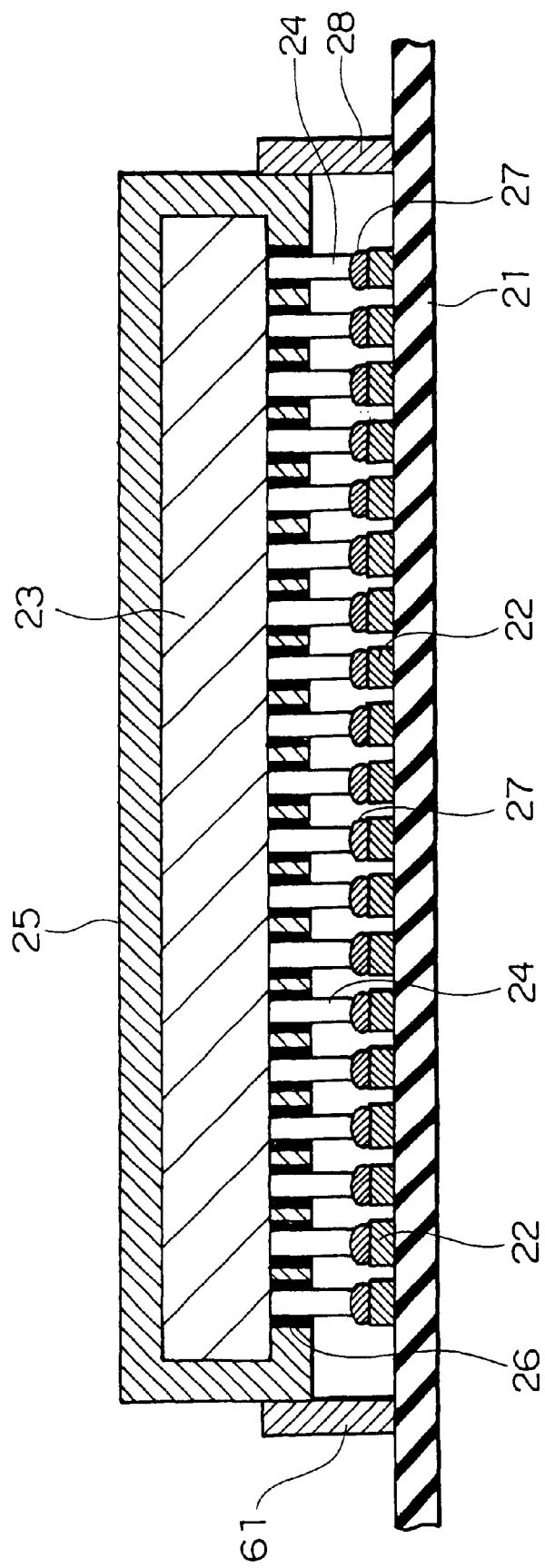
FIG. 6 shows a sectional view of an electronic device structure according to a second embodiment of this invention.

Referring to FIG. 6, the description will made about an electronic device structure according to a second embodiment of this invention. The electronic device structure is similar to the electronic device structure illustrated in FIG. 2 except for a high dam 61.

In FIG. 6, the high dam 61 is formed on the circuit board 21 so as to enclose not only the input/output terminals 24 but also under part of the metal case 25. An inner wall of the high dam 61 is in contact with a side surface of the metal case 25. It is possible that there is no space between the metal case and the high dam 61.

The high dam 61 shields not only the input/output terminals 24 but also a part of the body of the electronic component 23 from the electromagnetic waves. Accordingly, it is more difficult that the electromagnetic waves come from the outside arrives to the electronic component 23.

Figure 7:
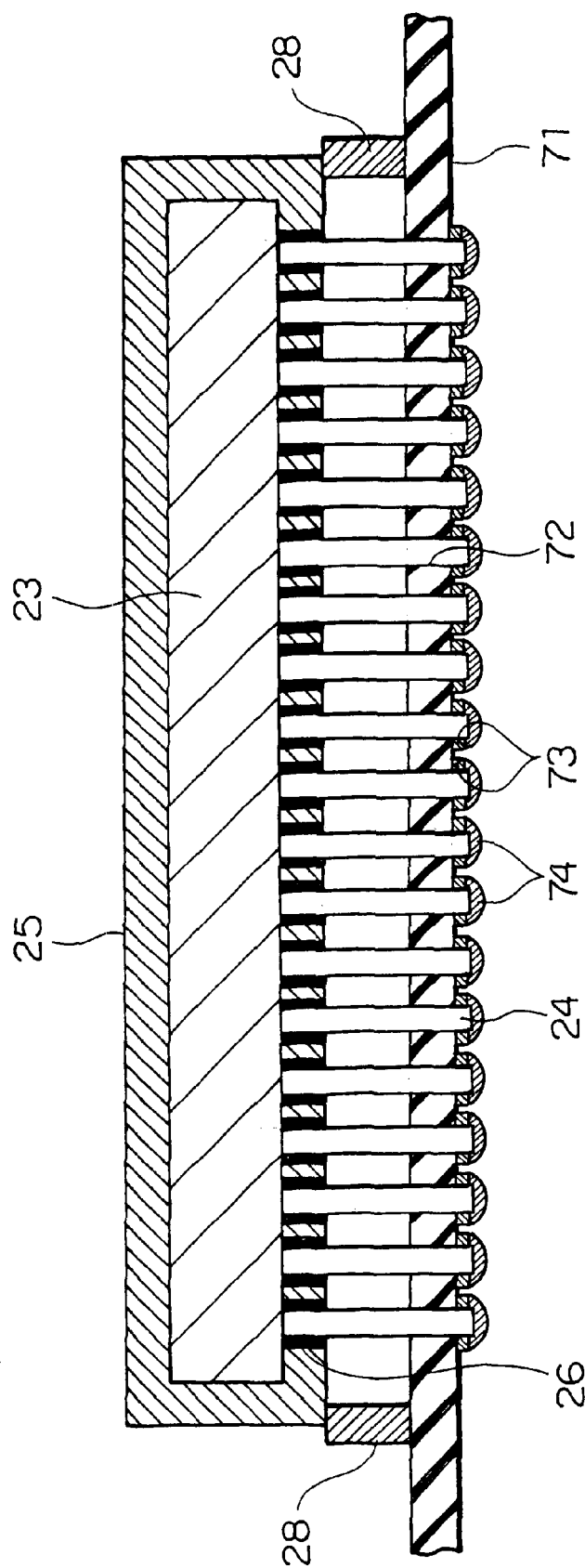
FIG. 7 shows a sectional view of an electronic device structure according to a third embodiment of this invention.

Referring to FIG. 7, the description will made about an electronic device structure according to a third embodiment of this invention. The electronic device structure is similar to the electronic device structure illustrated in FIG. 2 except for a circuit board 71 and length of the input/output terminals 24.

In FIG. 7, the circuit board 71 has a plurality of through holes 72 for receiving the input/output terminals 24. The input/output terminals 24 are inserted to the through holes 72, respectively, and connected to the printed circuit 73 by the soft solder 74 at the lower surface of the circuit board 71.

In this structure, the high dam 28 prevents the electronic component 23 and the metal case 25 from bumping on the circuit board 71 when the electronic component 23 is put on the circuit board 71. Moreover, the high dam 28 prevents the metal case 25 from electrically connecting with the printed circuit on the circuit board 71.

While this invention has thus for been described in conjunction with the preferred embodiment thereof, it will readily be possible for those skilled in the art to put this invention into practice in various other manners. For example, the high dam may be made of (a) other metal(s) or a magnetic body. Moreover, the high dam may be other shape. Moreover, the input/output terminals may be a ball type or other types.

What is claimed is:

1. An electronic device unit comprising:

a circuit board having a printed circuit, an electronic component having a body and an input/output terminal, wherein said input/output terminal projects from said body, is connected to said printed circuit, and supports said electronic component on said circuit board, and a first electromagnetic shielding formed on said circuit board for enclosing said input/output terminal when said electronic component is mounted on said circuit board, wherein said first electromagnetic shielding is located between said circuit board and said body mounted on the circuit board.

2. An electronic device unit as claimed in claim 1, wherein said body is covered with a second electromagnetic shielding.

3. An electronic device unit as claimed in claim 1, wherein said first electromagnetic shield has a square frame shape.

4. An electronic device unit comprising:

a circuit board having a printed circuit, an electronic component having a body and an input/output terminal, wherein said input/output terminal projects from said body, is connected to said printed circuit, and supports said electronic component on said circuit board, and a first electromagnetic shielding formed on said circuit board for enclosing said input/output terminal when said electronic component is mounted on said circuit board, wherein said first elecromagnetic shielding is made of conductive paste.

5. An electronic device unit as claimed in claim 4, wherein said conductive paste is solder paste.

6. An electronic device unit as claimed in claim 4, wherein said first electromagnetic shielding is made by a screen printing method using said conductive paste.

7. An electronic device unit as claimed in claim 4, wherein said body is covered with a second electromagnetic shielding.

* * * * *